United States Patent [19]
Murayama et al.

[11] 3,931,446
[45] Jan. 6, 1976

[54] PROCESS FOR PRODUCING POLYMERIC PIEZOELECTRIC ELEMENTS AND THE ARTICLE FORMED THEREBY

[75] Inventors: Naohiro Murayama, Iwaka; Takao Oikawa, Iwaki, both of Japan

[73] Assignee: Kureha Kagaku Kogyo Kabushiki Kaisha, Tokyo, Japan

[22] Filed: Mar. 11, 1974

[21] Appl. No.: 449,809

Related U.S. Application Data

[63] Continuation-in-part of Ser. No. 184,170, Sept. 27, 1971, abandoned.

[30] Foreign Application Priority Data

Sept. 26, 1970 Japan.............................. 45-83771

[52] U.S. Cl. .................. 428/421; 427/12; 427/100; 427/124; 427/171; 427/379; 427/380; 427/385; 428/457
[51] Int. Cl.$^2$ ...................... B05D 5/12; B32B 27/00
[58] Field of Search ............. 117/227, 213; 310/9.5, 310/8; 427/100, 12, 379, 380, 124, 171, 385; 428/421, 457

[56] References Cited
UNITED STATES PATENTS

| | | | |
|---|---|---|---|
| 3,197,538 | 7/1965 | Capron et al. | 264/288 |
| 3,691,264 | 9/1972 | Asahina | 264/22 |
| 3,798,473 | 3/1974 | Murayama et al. | 310/8 |

OTHER PUBLICATIONS

Kawai, H., Piezoelectricity of Poly(Vinylidene Fluoride), In Chemical Abstracts, 71:81983, 1969.
Nakamura et al., Piezoelectricity, Pyroelectricity, and The Electrostriction Constant of Poly(Vinylidene Fluoride), In Journal of Polymer Science, Part A–2, 9: pp. 161–173, Jan. 1971.

*Primary Examiner*—Cameron K. Weiffenbach
*Attorney, Agent, or Firm*—Sughrue, Rothwell Mion Zinn & Macpeak

[57] ABSTRACT

A highly piezoelectric polyvinylidene fluoride element is prepared by treating a polyvinylidene fluoride film having an infrared absorbance ratio $D_{530}/D_{510}$ of not more than 1.2, namely having a major proportion of $\beta$-type crystal structure, at a temperature of at least 40°C but below the melting point of the film while applying to the film a direct current voltage of 200 KV/cm to 1,500 KV/cm. The polyvinylidene fluoride film having a major proportion of $\beta$-type crystal structure may be obtained by stretching a fabricated article of polyvinylidene fluoride having a major proportion of $\alpha$-type crystal structure under specific conditions.

11 Claims, 5 Drawing Figures

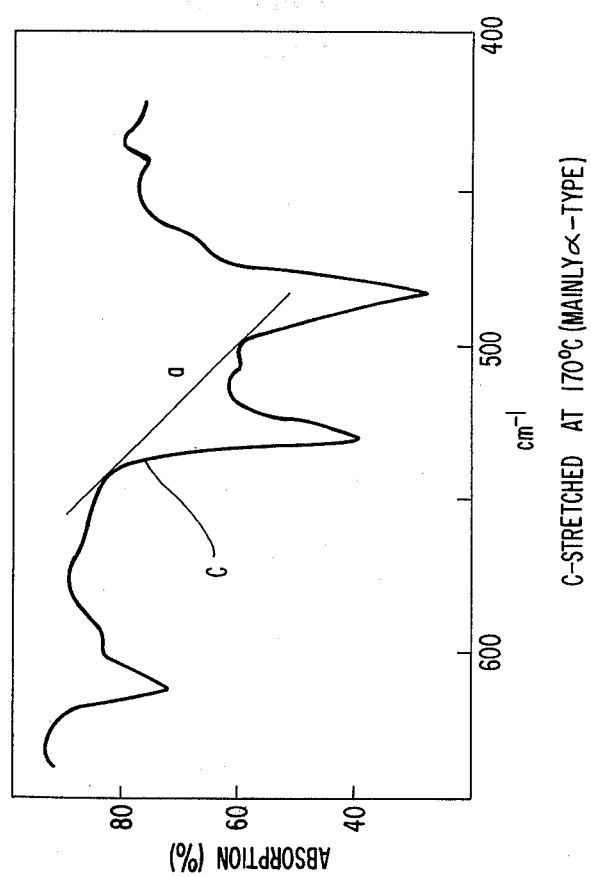
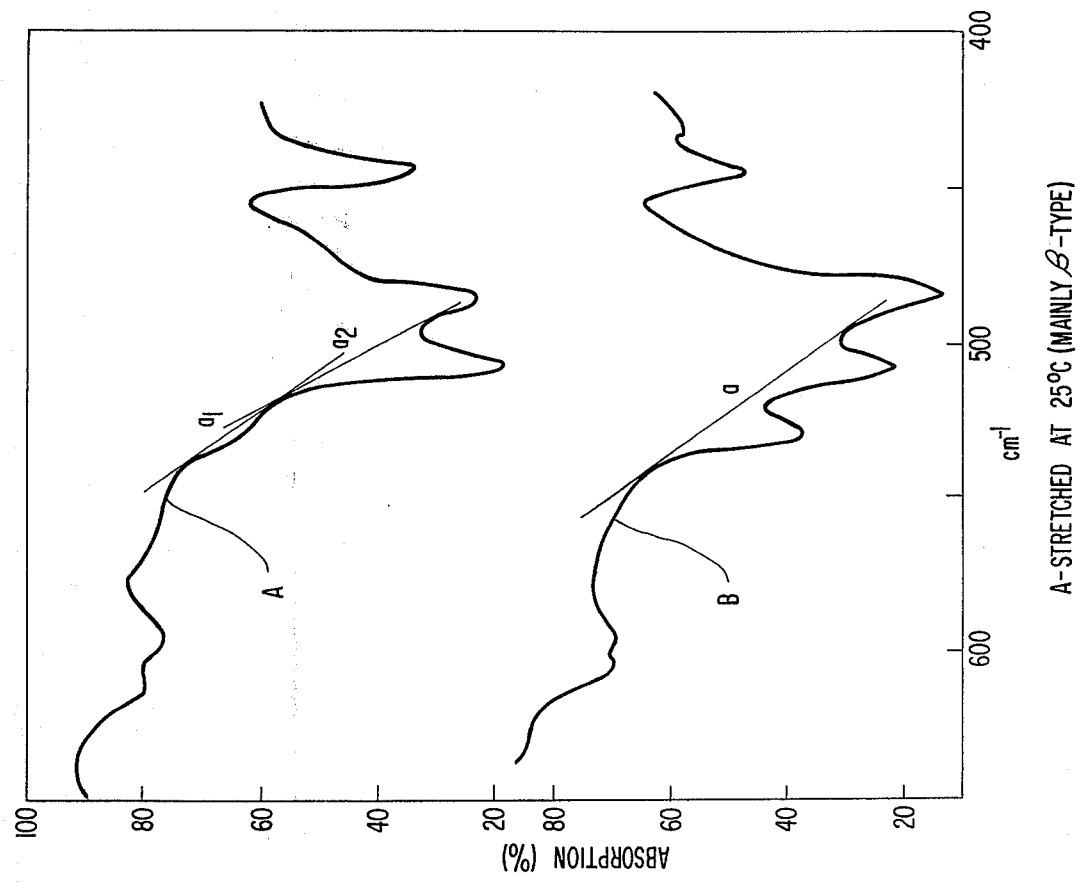
FIG. 3a
FIG. 3b
A - STRETCHED AT 25°C (MAINLY β-TYPE)
B - STRETCHED AT 110°C (α-TYPE + β-TYPE)
C - STRETCHED AT 170°C (MAINLY α-TYPE)

PROCESS FOR PRODUCING POLYMERIC PIEZOELECTRIC ELEMENTS AND THE ARTICLE FORMED THEREBY

CROSS-REFERENCE TO RELATED APPLICATION

This is a continuation-in-part application of copending application, Ser. No. 184,170, filed Sept. 27, 1971, now abandoned.

FIELD OF THE INVENTION

This invention relates to a process for producing polymeric piezoelectric elements using polyvinylidene fluoride as the material for the piezoelectric elements.

BACKGROUND OF THE INVENTION

Inorganic crystals such as quartz, rochelle salt, or barium titanate have been known for a long time as piezoelectric materials, and in recent years some vital substances or synthetic polymers have become known to have piezoelectric properties. As living tissues having piezoelectric properties, there have been known bones, skins, blood vessels, muscles, hairs, ivories, silk yarns, bamboos, timbers, and the like, and it is also considered that most proteins have piezoelectric properties. Piezoelectric properties are also observed in uniaxially stretched films of polymers of simple amino acids such as polybenzyl glutamate or polymethyl glutamate which are synthetic polymers.

On the other hand, when a direct current high voltage is applied to a polymeric film at relatively gigh temperatures and the film is then cooled, it becomes the so-called electret. It has long been known that electrets have piezoelectric properties. Recently, with the development of polymeric electrets, the piezoelectric properties of various electrets have been examined, and it has been found that films of polar polymers such as polyvinylidene fluoride (to be referred to as PVDF), polyvinyl fluoride, or polyvinyl chloride especially have high piezoelectric properties. In particular, PVDF has been found to have high piezoelectric properties. For example, PVDF film is uniaxially stretched at 120°–150° C to several times the original length, and formed into an electret in an electric field of about 300 KV/cm at 50°–90° C. This results in the formation of a piezoelectric PVDF film having a piezoelectric constant $d_{31}$ of a maximum of $2 \times 10^{-7}$ c.g.s.e.s.u. (the stretching direction being X axis).

SUMMARY OF THE INVENTION

Extensive research and development work of the inventors of the present application of PVDF and PVDF electret have led to a process for producing PVDF films having far higher piezoelectric properties than any known piezoelectric polymeric films.

The PVDF film as an element of the present invention is quite different from an electret, which is a dielectric body having the external electric field obtained by the application of a direct current voltage to a polymeric film and which has been conventionally known. Needless to say, the condition for the electret is that the external electric field thereof is large and hard to attenuate, in which point the electret is distinguished from merely charged dielectric bodies. On the other hand, an electret of PVDF can not maintain its surface charge for a long time, and it may even be said that such electret does not qualify as an electret.

In the process of the present invention it has been found that the surface potential has no direct relation with piezoelectric properties, and that the pursuit of the electret having a high surface potential and little attenuation thereof is not useful for obtaining a film having high piezoelectric properties and with little attenuation in these properties.

The piezoelectric film according to the present invention does not necessarily have an external electric field but rather exhibits high piezoelectric properties after loss of the external electric field. In this respect it is a novel polarized dielectric body which is quite different from a conventional electret having an external electric field.

PVDF mainly has two crystal types, α-type and β-type. Generally, films of PVDF have been produced by polarizing a film of the α-type crystal structure with small piezoelectric properties. On the other hand, the present invention provides a process a previously unknown and unique film having high piezoelectric properties by polarizing a film of β-type crystal structure, and for obtaining a new piezoelectric element by attaching electrodes to both surfaces of the resulting film. In this case the film of the β-type crystal structure is obtained by stretching a film of the α-type crystal structure at low temperature. A temperature as low as possible is preferable to obtain a film of a complete β-type crystal structure.

The present invention provides a process for producing piezoelectric elements which comprises stretching a PVDF film having a major proportion of the α-type crystal structure at as low a temperature as possible to form a film having a major proportion of the β-type crystal structure, heat-treating the film under tension if necessary, and then heat-treating it under a direct current electric field (polarization treatment) thereby to form electrodes on both surfaces thereof.

Electrodes are indispensable to piezoelectric elements, although their formation can be made before or after the polarization treatment.

DETAILED DESCRIPTION OF THE INVENTION

Figure 1:
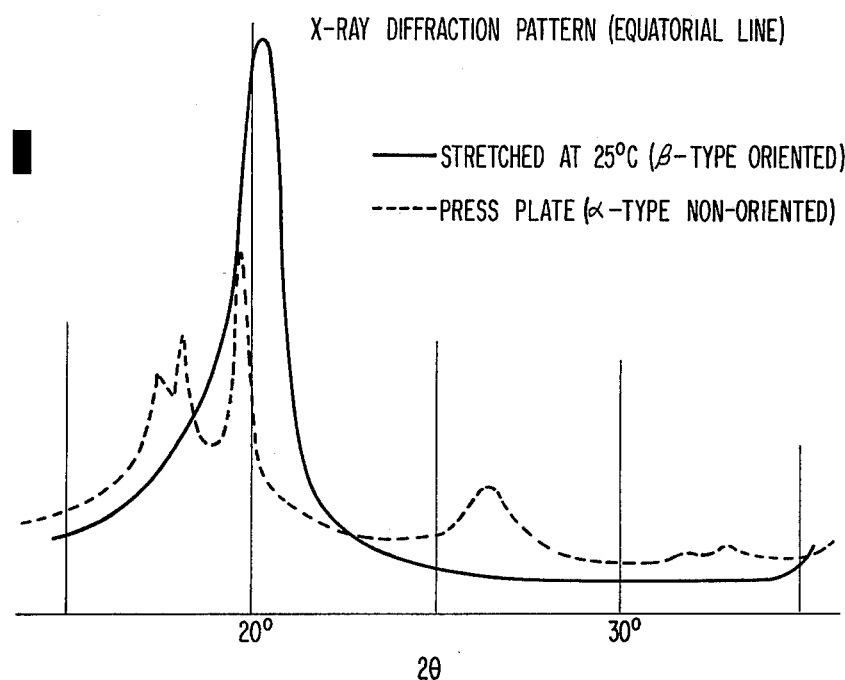

The present invention relates to the production of films of PVDF having high piezoelectric properties by polarizing a film of the β-type crystal structure.

The piezoelectric properties, as used in the present specification and claims, refer to tensile piezoelectric properties. When the stretching direction of a film is in the X axis and the planar direction at right angles to the X axis is the Z axis, the piezoelectric properties of the film in the Z axis direction are measured and are made the piezoelectric properties of the film in the present invention. At this time, the piezoelectric constant is expressed by $d_{31}$. Naturally, other constants such as $d_{33}$ and $d_{32}$ are not expected to be zero, and some constants will be as large as $d_{31}$. Applications will be conceivable in which these other constants are utilized.

PVDF mainly has two crystal types, α-type and β-type. The conformation of the main chain is generally TGEG' in the case of the α-type, and TT (planar zig-zag) in the case of β-type. The β-type crystal lacks a center of symmetry and is of a structure wherein dipoles face in the same direction. Fabricated articles of the α-type crystal structure are obtained by cooling the material from its molten state, whereas those having the β-type crystal structure are produced by casting the material from a solution in a good solvent such as dimethylacetamide or dimethyl sulfoxide, heat-treating the cast film at high pressures, or stretching it at relatively low temperatures.

PVDF has the α-type crystal structure when cooled from its molten state, and it is impossible to produce β-type films only by melt-extrusion procedure. However, when the film is stretched by more than 130% in at least one direction at a low temperature, not higher than 110° C, the resulting film has a major proportion of the β-type crystal structure. When the stretching of the film is performed at low temperatures, the temperature of PVDF itself tends to rise by self-heat-generation, and the film may readily take the β-type crystal structure. Hence, the stretching should be carried out carefully and preferably at the slowest possible rate of stretching at low temperatures. Such films of the β-type crystal structure which have been produced with care will show far higher piezoelectric properties, by polarization treatment, than conventional piezoelectric PVDF films. As will be seen from examples appearing hereinafter, such films have a $d_{31}$ of as large as more than $2 \times 10^{-7}$ c.g.s.e.s.u.

The piezoelectric effect can be expected with any films having a major proportion of the β-type crystal structure. The proportion of the β-type crystal structure is determined mainly by the stretching temperature and the stretch ratio, and can be determined using an absorbance ratio as an index which is obtained by infrared absorption spectroscopy. When the absorption spctrum of the sample in the KBr region is taken, the absorptions appearing in the vicinity of 530 cm$^{-1}$ and 510 cm$^{-1}$ are considered, respectively, to be α-type and β-type crystal bands, and the absorbance ratio $D_{530}/D_{510}$ constitutes a good index.

Where a given sample for measurement of the absorbance ratio has a large thickness, the ratio cannot be determined by a transmission method, and a reflecting method must be used.

In this case, the spectrum to be obtained of the sample sometimes differs depending upon whether the stretching direction of the sample is parallel to the reflecting direction of light or whether it is perpendicular to the reflecting direction. It is therefore necessary to set these two directions in a parallel relationship to each other during the measuring procedure.

We have found that better piezoelectric films are obtained with smaller $D_{530}/D_{510}$ ratios, namely with a greater proportion of the β-type crystal structure, and especially that when a PVDF film having a $D_{530}/D_{510}$ ratio of not more than 1.2 is treated in an electric film of 200 KV/cm to 1,500 KV/cm at a temperature between 40° C and the melting point of the film there can be obtained a high performance piezoelectric films having a maximum $d_{31}$ of more than $5 \times 10^{-7}$ c.g.s.e.s.u. which has never been obtained from any conventional polymeric films.

The films of the β-type crystal structure so obtained may be heat-treated under tension prior to polarization in order to improve the piezoelectric properties. The heat-treating temperature may be at least 80°C and up to the melting point of the film, but when the temperature is near the melting point, the treating time must be shortened. At 150°C, sufficient effect is obtained by treating the film for 30 minutes. If the film is heat-treated with both ends being free, the piezoelectric constant of the film does not change much so long as the treating temperature is not higher than 150°C.

The film of the β-type crystal structure is then formed into a piezoelectric film. Polarization is performed in a usual manner by holding the film with electrodes, applying a direct current high voltage thereto, maintaining the film in this state for a predetermined time at a predetermined temperature higher than room temperature.

In the present invention it is essential to apply the direct current voltage to a film above 40°C it is not necessarily required to cool the film while applying the direct current voltage. For example, just after the application of the direct current voltage the electrodes can be removed and the film may be removed from the area of treatment and allowed to cool. In that case the piezoelectric properties tend to decrease according to heat treatment effect, but the piezoelectric properties do not decrease very much when the heat treatment effect is small. However, it is preferable to cool the film to room temperature while applying the voltage when the film is cooled.

With respect to the above the piezoelectric elements of the present invention differ from the so-called electret having a surface charge, and have the stable piezoelectric properties even at the polarizing temperature.

The electrodes may be adhered to the film, for example by vacuum vaporization, or may be spaced from the film. Higher voltages below the voltage which the film can withstand may produce better results, but for practical purposes, the voltage is desirable from 200 KV/cm to 1,500 KV/cm. The time needed for polarization may be one sufficient for temperature elevation, and generally ranges from 10 minutes to 2 hours with a longer time being preferred for sufficient polarization. Films of the β-type exhibit high piezoelectric properties when treated at room temperature to a temperature near the melting point of the films, desirably 50° C to about 160° C. In contrast, conventional piezoelectric films have different piezoelectric properties according to the polarizing temperature. There is a threshold in the vicinity of 60° C. Usually, many such conventional films hardly show piezoelectric properties when subjected to a polarization treatment at a temperature not higher than 60° C, and therefore temperatures of 80° C to 90° C have been used as the polarizing temperature.

The PVDF films of the present invention which have a major proportion of the β-type crystal structure not only have high piezoelectric constant values, but also can be polarized formed into piezoelectric films at low temperatures. These are features which also distinguish the present invention from conventional processes. For example, as shown in the examples, when polarization is performed at 40° C in an electric field of 320 KV/cm, the β-type film and the α-type film exhibit outstanding differences. Judging from samples of various $D_{530}/D_{510}$ ratios, films having a $D_{530}/D_{510}$ ratio of not more than 1.2 seen to exhibit the characteristics of the β-type and the film having a $D_{530}/D_{510}$ ratio of not more than 0.6 exhibit fully the characteristics of the β-type.

The piezoelectric elements according to the present invention are generally used with electrodes on both surfaces thereof. Electroconductive materials such as metal, carbon, electroconductive glass and electroconductive polymer can be used as electrodes for the piezoelectric elements. It is preferable that the electrodes adhere to the piezoelectric moulded article but they may be spaced from the article. The electrodes may be adhered in a film state, may be pressed to the article or may be formed by vacuum vaporization. Metals desirable for vacuum vaporization are gold, aluminum, tin, zinc, nickel, chrome, platinum or a mixture thereof. In addition, an electroconductive metal oxide or transparent electrodes such as NESA glass may be employed. The time of formation of those electrodes can be separate from the polarization treatment but ultimately the film is used with electrodes on both surfaces thereof.

In particular, the electrodes formed by vacuum vaporization are desirable for electro-acoustic transducers since they are thin and light by weight.

The piezoelectric films of the present invention find wide industrial applications including electroacoustic transducers, electric mechanical transducers, pressure detecting devices, mechanical filters, press-sensing elements, and other applications in which the piezoelectric properties are utilized. Because of the larger piezoelectric constants of the films of the invention than quartz and of the inherent properties as film, even wider applications of the piezoelectric films of the invention can be expected in the future. Furthermore, the piezoelectric film of the invention has a very high pyroelectric current, and is useful as a pyroelectric element.

The invention will be further described by the following examples which are presented for illustrative, rather than limitative, purposes.

EXAMPLE 1

Powders of PVDF obtained by suspension-polymerization were fabricated into a press plate of a thickness of about 0.3 mm at 220° C using a hot press. The plate was stretched at 25° C at a rate of 20 mm/min. using a tensile tester (Tensilon, product of Toyo Seiki). The resulting transparent film which had thus been uniaxially drawn to about 3 times the original dimension had a thickness of 0.1 mm. The results of the X-ray diffraction analysis of this film on the equatorial line are shown in FIG. 1 in comparison with those obtained with the original press plate. FIG. 1 is an X-ray diffraction pattern (on the equatorial line) of the press plate of polyvinylidene fluoride and of the film obtained by stretching the press plate at 25° C. It is seen from this Figure that the original crystal structure is the $\alpha$-type, whereas the resulting uniaxially stretched film has an almost complete $\beta$-type crystal structure. The absorbance ratio $D_{530}/D_{510}$ of this film was 0.04.

This $\beta$-type uniaxially stretched film was subjected to polarization treatment (if desired, after pretreatment). The polarization treatment was performed in a usual manner by holding the film with stainless steel electrodes, maintaining the film at a predetermined temperature indicated in Table 1 for one hour while a direct current high voltage was being applied to the film, and then allowing the film to cool to room temperature and then the electrodes were adhered to both surfaces thereof using a silver emulsion transfer tape. The voltage was varied as shown in Table 1.

Figure 2:
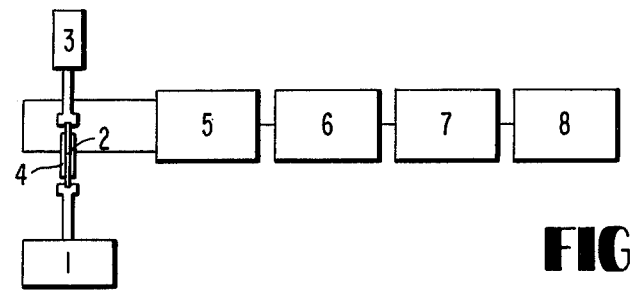

Then the piezoelectric constant $d_{31}$ of the element in the stretching direction was measured using a measuring apparatus shown in FIG. 2 of the accompanying drawings. FIG. 2 is a block diagram of an apparatus for measuring the piezoelectric constant. The specimen 2 is stretched by vibrator 1, and the pressure applied at this time was detected by stress gauge 3. The devices 1 and 3 were those of a rheometer (product of RION Co., Ltd.). Sine waves of 15 cycles/sec. were employed as the frequency of the vibrator in order to avoid resonance. A silver emulsion transfer tape was used as electrodes 4. Leading lines having a size of about 100 $\mu$ were adhered to the electrodes using a conductive paint, Dotite (product of Fujikura-Kasai Ltd.). The amount of electricity generated at this time was pressed through a circuit of charge amplifier 5, inverting amplifier 6, and active filter 7, and measured by alternating voltmeter 8.

The results are also shown in Table 1.

The above measurement was performed while an equilibrium stress of $10^4$ gr/cm$^2$ was being exerted on the film in order to maintain the film in a tensioned state. The same conditions were used in the subsequent examples in measuring piezoelectric constants.

As control examples, the piezoelectric constants of the film which was not polarized, the PVDF press plate, a film obtained by stretching the press plate at 170° C, and a polarized sample of this film were also measured, and the results are given in Table 1.

Since the piezoelectric constant of the film stretched at 25° C is very small, the piezoelectric properties as high as more than several thousand times are observed under the same condition. As compared with the $\alpha$-type films, the films obtained by the present invention have piezoelectric properties as high as about 60 times under the same conditions.

Table 1

| Run No. | Pretreatment | Polarizing Temperature (°C) | Electric Field Intensity (KV/cm) | $d_{31}$ (c.g.s.e. s.u.) |
|---|---|---|---|---|
| 1 | None | 40 | 320 | $1.2 \times 10^{-7}$ |
| 2 | None | 50 | 320 | $4.3 \times 10^{-7}$ |
| 3 | None | 90 | 320 | $5.1 \times 10^{-7}$ |
| 4 | None | 110 | 320 | $3.0 \times 10^{-7}$ |
| 5 | None | 150 | 320 | $4.5 \times 10^{-7}$ |
| 6 | None | 90 | 500 | $1.2 \times 10^{-6}$ |
| 7 | None | 90 | 700 | $1.5 \times 10^{-6}$ |
| 8 | None | 90 | 1,000 | $1.2 \times 10^{-6}$ |
| 9 | Heat treatment at 150°C for 30 minutes under tension | 90 | 320 | $7.6 \times 10^{-7}$ |
| 10 | Heat treatment at 150°C for 30 minutes with both ends free | 90 | 320 | $4.2 \times 10^{-7}$ |
| 11 (control) | Neither pretreated nor polarized | | | less than $10^{-10}$ |
| 12 (control) | PVDF press plate of 150 $\mu$ | | | less than $10^{-10}$ |
| 13 (control) | Film obtained by stretching PVDF at 170°C to 2.2 times but not polarized (see Example 4) | | | less than $10^{-10}$ |
| 14 (control) | A polarized film from the above film (40°C, 320 KV/cm) | | | $5.0 \times 10^{-10}$ |
| 15 (control) | A polarized film from the above film (90°C, 320 KV/cm) | | | $9.5 \times 10^{-9}$ |

EXAMPLE 2

Powders of PVDF obtained by suspension polymerization were fabricated into a press plate having a thickness of about 0.2 mm at 220° C using a hot press. The press plate was rolled to about two times the original length using a fully cooled roll. A transparent, uniaxially stretched film having much the same width at the original plate was obtained. The X-ray diffraction pattern of this film well resembled that shown in Example 1, and the main crystal structure was $\beta$-type. The film was polarized in the same way as set forth in Example 1, and then the electrodes were adhered to both surfaces thereof using a silver emulsion transfer tape. The piezoelectric constant of the element in the stretching direction was measured. The results are shown in Table 2. The absorbance ratio $D_{530}/D_{510}$, measured by the same method as shown in Example 4, of this film was 0.22.

Table 2

| Run No. | Pretreatment | Polarizing Temperature (°C) | Electric Field Intensity (KV/cm) | $d_{31}$ (c.g.s. e.s.u.) |
|---|---|---|---|---|
| 1 | None | 90 | 320 | $4.5 \times 10^{-7}$ |
| 2 | None | 90 | 500 | $9.1 \times 10^{-7}$ |

EXAMPLE 3

Powders of PVDF obtained by suspension polymerization were fabricated into a sheet of about 0.4 mm thickness using an extruder. The sheet was brought into contact with a roll, and by local heating of the contact part, stretched to 4 times the original length. The temperature of the film during stretching was measured by a surface temperature measuring instrument, and found to be 110°C. The X-ray diffraction pattern of the film obtained indicated that it contained a major proportion of the β-type crystal structure. The film had an absorbance ratio $D_{530}/D_{510}$ of 0.69 (see Example 4). The film was polarized in the same way as set forth in Example 1, and the electrodes were adhered to both surfaces thereof using a silver emulsion transfer tape. The piezoelectric constant of the element in the stretching direction was measured. The results are given in Table 3.

Table 3

| Run No. | Pretreatment | Polarizing Forming Temperature (°C) | Electric Field Intensity (KV/cm) | $d_{31}$ (c.g.s. e.s.u.) |
|---|---|---|---|---|
| 1 | None | 40 | 320 | $1.3 \times 10^{-8}$ |
| 2 | None | 50 | 320 | $5.0 \times 10^{-8}$ |
| 3 | None | 90 | 320 | $1.9 \times 10^{-7}$ |
| 4 | None | 110 | 320 | $4.1 \times 10^{-8}$ |
| 5 | None | 140 | 320 | $1.8 \times 10^{-7}$ |
| 6 | None | 90 | 500 | $7.7 \times 10^{-7}$ |
| 7 | None | 90 | 700 | $8.0 \times 10^{-7}$ |
| 8 (control) | The film not polarized | | | $1.9 \times 10^{-9}$ |

EXAMPLE 4

Powders of PVDF obtained by suspension polymerization were fabricated into a press plate having a thickness of about 0.2 mm using a hot press at 220°C. The press plate was stretched at a rate of 20–50 mm/min. at 70°C, 130°C, 150°C, and 170°C, respectively. The stretched film was polarized by treating at 40°C for one hour in an electric field of 320 KV/cm and the electrodes were adhered to both surfaces thereof using a silver emulsion transfer tape. The piezoelectric constant of the element in the stretching direction was measured, and the results are shown in Table 4 together with the results obtained with the piezoelectric element of Examples 1 and 3 under the same conditions.

The absorbance ratio $D_{530}/D_{510}$ of the piezoelectric films was also measured in order to compare the electrets in terms of the proportion of the β-type crystal structure. The film sample was mounted with the film stretching direction corresponding with the incident direction of light, using a multipath reflective attachment in a diffraction grating infrared spectrometer (Hitachi Type EPIL), and the infrared spectrum of the sample was taken. FIG. 3a of the accompanying drawings shows a spectrum of the film samples stretched at 25°C (A) and 110°C (B), and FIG. 3b shows a spectrum of the film sample stretched at 170°C (C). As shown in the drawings, the tangent line drawn in contact with the peaks in the vicinity of 500 cm$^{-1}$ and 545 cm$^{-1}$ was used as base line $a$ (B and C). But in the case of the sample having a large content of the β-type crystal structure, the peak near 520 cm$^{-1}$ intersects the tangent line. Therefore, in this case (A), the tangent lines drawn in contact with the two adjoining peaks such as the tangent lines $a_1$ and $a_2$ in FIG. 3a were used as base lines for $D_{530}$ and $D_{510}$.

The results are shown in Table 4. The X-ray diffraction pattern showed that the samples having a $D_{530}/D_{510}$ of 0.04 and 8.6 have a very large proportion of the β-type and α-type crystal structures, respectively.

Table 4

| Run No. | Stretching Temperature (°C) | Stretch Ratio | $d_{31}$ (d.g.s.e.s.u.) | $D_{530}/D_{510}$ |
|---|---|---|---|---|
| 1 | 25 (Run No. 1 of Example 1) | about 3 | $1.2 \times 10^{-7}$ | 0.04 |
| 2 | 70 | 2.5 | $5.9 \times 10^{-8}$ | 0.15 |
| 3 | 78 | about 2 | $4.0 \times 10^{-8}$ | 0.26 |
| 4 | 86 | about 2 | $2.4 \times 10^{-8}$ | 0.46 |
| 5 | 95 | about 2 | $3.5 \times 10^{-8}$ | 0.38 |
| 6 | 110 (Run No. 1 of Example 3) | about 4 | $2.0 \times 10^{-8}$ | 0.69 |
| 7 | 130 | 2.2 | $1.2 \times 10^{-8}$ | 1.2 |
| 8 | 150 | 2.3 | $3.4 \times 10^{-9}$ | 3.0 |
| 9 | 170 | 2.2 | $5.0 \times 10^{-10}$ | 8.6 |

It is seen from the above table that the films having a major proportion of the β-type crystal structure show large piezoelectric constants.

EXAMPLE 5

PVDF powders obtained by emulsion polymerization at 100°C were fabricated into a press plate using a hot press at 250°C. The place was then stretched at room temperature to form a α-type film having a thickness of 120μ. The film was then polarized at 100°C for one hour in an electric film of 320 KV/cm and the electrodes were adhered to both surfaces thereof using a silver emulsion transfer tape. The piezoelectric constant $d_{31}$ of the resulting element was $7.5 \times 10^{-7}$ c.g.s.e.s.u.

EXAMPLE 6

Figure 4:
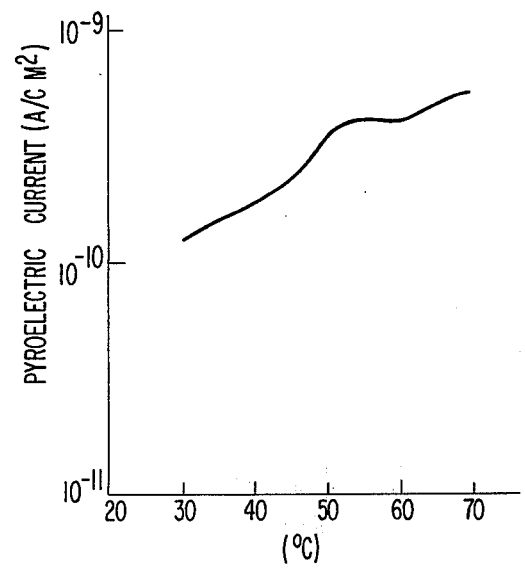

A 50μ thick T-die sheet was stretched to about 3.6 times the original length in the same way as set forth in Example 3 to form a 14μ thick film. The film was heat treated for 30 minutes at 150°C under tension, and then an electrode was provided on both surfaces of the film by vacuum evaporation of aluminum. The film was maintained in an electric field of 400 KV/cm at 90°C for one hour, and then the temperature was lowered to room temperature. The pyroelectric current of the film was measured while elevating the temperature at a rate of 1°C/min. The measurement was made using a vibrating reed electrometer (TR-84M type, Takeda Riken Industry Co., Ltd.). There was obtained a pyroelectric current as shown in FIG. 4. This film sample had a piezoelectric constant of $1.5 \times 10^{-7}$ c.g.s.e.s.u.

From the measurement of the pyroelectric current, it was seen that the piezoelectric film of the present invention has a very large inner polarization.

EXAMPLE 7

T-die sheets obtained by a melt-extrusion of PVDF were heated and stretched to 4 times the original length by being brought into contact with a roll at 90°C to be a film of 50μ in thickness. The absorbance ratio $D_{530}/D_{510}$ of this film was 0.13. Aluminum electrodes were formed on both surfaces of this film by vacuum evaporation.

The resultant film was maintained in a condition of 100°C and 600 KV/cm for 20 hours, and then cooled to room temperature (24°C) in 30 minutes. In this case the time to remove the voltage was charged as shown in the following Table 5 and the piezoelectric constant of each resultant piezoelectric film was measure.

Table 5

| | Conditions | $d_{31}$ (c.g.s.e.s.u.) |
|---|---|---|
| 1. | The voltage was removed after cooling the film to room temperature. | $5.4 \times 10^{-7}$ |
| 2 | The film was cooled to room temperature just after removing the voltage. | $4.1 \times 10^{-7}$ |
| 3. | The film was cooled to 80°C while applying the voltage and was removed from the heated area to cool to room temperature just after removing the voltage | $5.2 \times 10^{-7}$ |

As can be clearly understood from the above Table, the piezoelectric properties slightly decrease when the voltage is removed before cooling of the film, but each film has high piezoelectric properties sufficient for practical use.

EXAMPLE 8

Powders of PVDF obtained by suspension-polymerization were fabricated into a sheet of 0.2 mm in thickness using a T-type die. This sheet was brought into contact with a roll at 90°C and was uniaxially drawn to about 4 times the original length due to local heating of the contact part. The absorbace ratio $D_{530}/D_{510}$ of this film was 0.13 and the thickness was 0.05 mm. The resulting uniaxially stretched film was subjected to polarization treatment by applying a direct current electric field of 500 KV/cm at 90°C for 30 minutes and cooled to room temperature while applying the electric field.

The change with the passage of time of the piezoelectric constant and the surface potential of this film at room temperature was measured. In this case a transfer tape (product of VITTA CORPORATION) was used as electrodes.

The results of measurement of the piezoelectric constant $d_{31}$ and the surface potential at each point in time are given in Table 6. The surface potential is a value obtained by dividing the measured value obtained by the thickness of the film.

Table 6

| Time | $d_{31}$ (c.g.s.e.s.u.) | Surface Potential V/mm |
|---|---|---|
| 0 | $1.2 \times 10^{-7}$ | 1300 |
| 100 | $1.1 \times 10^{-7}$ | — |
| 1000 | $1.3 \times 10^{-7}$ | −10 |
| 10000 | $1.2 \times 10^{-7}$ | −10 |

Further, the film produced under the same condition was steeped in pure water at room temperature and the piezoelectric constant and the surface potential thereof were measured. The results are shown in Table 7.

Table 7

| | $d_{31}$ (c.g.s.e.s.u.) | Surface Potential (V/mm) |
|---|---|---|
| Before Steeping | $1.2 \times 10^{-7}$ | 1,300 |
| After Steeping | $1.2 \times 10^{-7}$ | 0 |

It is seen from the above Table that the piezoelectric film of the present invention is extremely stable and its piezoelectric properties have no relation with the surface potential, which will be also seen from the following reference experiment.

The piezoelectric properties and the surface potential were measured with respect to polystyrene, polytetrafluoroethylene and polypropylene. The results of measurement of the piezoelectric constant $d_{31}$ and the surface potential as well as the polarizing condition are shown in Table 8.

Table 8

| Resin | $d_{31}$ (c.g.s.e.s.u.) | Surface Potential (V/mm) | Polarizing Condition |
|---|---|---|---|
| Polystyrene | ≅ 0 | 2,200 | 98°C, 500 KV/cm |
| Polytetrafluoroethylene | $10^{-9}$ | 3,300 | 150°C, 500 KV/cm |
| Polypropylene | $< 10^{-9}$ | 23,000 | 100°C, 500 KV/cm |
| PVDF | $1.2 \times 10^{-7}$ | 1,300 | 90°C, 500 KV/cm |

It is seen from the above Table that the surface potential and piezoelectric properties have no relation with each other, and that resins generally regarded as excellent electrets barely have any piezoelectric properties.

While the invention has been particularly shown and described with reference to preferred embodiments thereof, it will be understood by those skilled in the art that the foregoing and other changes in form and details may be made therein without departing from the spirit, and scope of the invention.

What is claimed is:

1. A polarized piezoelectric film comprising an oriented or unoriented polyvinylidene fluoride having electrodes on both surfaces, wherein said PVDF has an infrared absorbance ratio $D_{530}/D_{510}$ of not more than 1.2.

2. The film of claim 1, wherein said PVDF has an infrared absorbance ratio $D_{530}/D_{510}$ of not more than 0.6.

3. The film of claim 1, wherein said electrodes are formed by a vacuum metallizing process.

4. The film of claim 1, wherein said film has a piezoelectric constant in excess of $1.5 \times 10^{-7}$ c.g.s.e.s.u.

5. A process for producing highly piezoelectric elements which comprises stretching a polyvinylidene fluoride film having a major proportion of the α-type crystal structure at a temperature not higher than 100°C in at least one axial direction to form a polyvinylidene fluoride film having a major proportion of the β-type crystal structure as exibited by an infrared absorbance ratio $D_{530}/D_{510}$ of not more than 1.2; attaching electrodes on both surfaces of the resulting film; and then treating the resulting film with the electrodes to a temperature of at least 40°C, but below the melting point of said film, while applying to said film a direct current voltage of between 200 KV/cm amd 1,500 KV/cm.

6. The process of claim 1, wherein said film is heated at a temperature of 50°C to 160°C.

7. The process of claim 1, wherein prior to said heating, said film having a major proportion of the β-type crystal structure is heat-treated under tension at a temperature of at least 80° C but below the melting point of said film.

8. The process of claim 1, wherein said film is heated for a period of 10 minutes to 2 hours.

9. The process of claim 1, wherein said electrodes are formed by a vacuum metallizing process.

10. The process of claim 1, wherein said stretching is conducted below 100°C.

11. The process of claim 1, wherein said film having a major part of the β-type crystal structure exibits an infrared absorbance ratio $D_{530}/D_{510}$ of not more than 0.6.

* * * * *